(12) United States Patent
Nakata et al.

(10) Patent No.: US 10,157,865 B2
(45) Date of Patent: Dec. 18, 2018

(54) SEMICONDUCTOR DEVICE WITH METAL FILM AND METHOD FOR MANUFACTURING SEMICONDUCTOR DEVICE WITH METAL FILM

(71) Applicant: Mitsubishi Electric Corporation, Tokyo (JP)

(72) Inventors: Yosuke Nakata, Tokyo (JP); Seiya Nakano, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/769,387

(22) PCT Filed: Oct. 4, 2013

(86) PCT No.: PCT/JP2013/077115
§ 371 (c)(1),
(2) Date: Aug. 20, 2015

(87) PCT Pub. No.: WO2014/136303
PCT Pub. Date: Sep. 12, 2014

(65) Prior Publication Data
US 2016/0005703 A1   Jan. 7, 2016

(30) Foreign Application Priority Data
Mar. 8, 2013   (JP) ................. 2013-046905

(51) Int. Cl.
*H01L 23/00* (2006.01)
*H01L 23/495* (2006.01)
*H01L 21/78* (2006.01)

(52) U.S. Cl.
CPC .............. *H01L 24/05* (2013.01); *H01L 21/78* (2013.01); *H01L 23/49531* (2013.01);
(Continued)

(58) Field of Classification Search
CPC ......... H01L 24/05; H01L 24/03; H01L 24/29; H01L 24/83; H01L 24/95; H01L 21/78;
(Continued)

(56) References Cited

U.S. PATENT DOCUMENTS 8,017,440 B2   9/2011   Machida
8,299,600 B2   10/2012  Sato et al.
(Continued)

FOREIGN PATENT DOCUMENTS

DE   10 2008 042 777 A1   4/2010
JP   2004-228461 A        8/2004
(Continued)

OTHER PUBLICATIONS

Notification of Transmittal of Translation of the International Preliminary Report on Patentability and Translation of Written Opinion of the International Searching Authority; PCT/JP2013/077115; dated Sep. 17, 2015.

(Continued)

*Primary Examiner* — Joseph C Nicely
*Assistant Examiner* — Wilner Jean Baptiste
(74) *Attorney, Agent, or Firm* — Studebaker & Brackett PC

(57) ABSTRACT

An element electrode is located on a surface of a semiconductor element. A metal film is located on the element electrode and includes an inner region and an outer region located around the inner region. The metal film has an opening that exposes the element electrode between the inner region and the outer region. The element electrode has solder wettability lower than solder wettability of the metal film. An external electrode is solder-bonded to the inner region of the metal film.

15 Claims, 15 Drawing Sheets

(52) U.S. Cl.
CPC ........ *H01L 23/49562* (2013.01); *H01L 24/03* (2013.01); *H01L 24/29* (2013.01); *H01L 24/32* (2013.01); *H01L 24/83* (2013.01); *H01L 24/95* (2013.01); *H01L 24/33* (2013.01); *H01L 24/45* (2013.01); *H01L 24/48* (2013.01); *H01L 2224/0345* (2013.01); *H01L 2224/0347* (2013.01); *H01L 2224/03848* (2013.01); *H01L 2224/04026* (2013.01); *H01L 2224/05007* (2013.01); *H01L 2224/05011* (2013.01); *H01L 2224/0568* (2013.01); *H01L 2224/05073* (2013.01); *H01L 2224/05124* (2013.01); *H01L 2224/05563* (2013.01); *H01L 2224/05565* (2013.01); *H01L 2224/05583* (2013.01); *H01L 2224/05624* (2013.01); *H01L 2224/05639* (2013.01); *H01L 2224/05644* (2013.01); *H01L 2224/05655* (2013.01); *H01L 2224/05666* (2013.01); *H01L 2224/26145* (2013.01); *H01L 2224/291* (2013.01); *H01L 2224/29027* (2013.01); *H01L 2224/29111* (2013.01); *H01L 2224/32257* (2013.01); *H01L 2224/33181* (2013.01); *H01L 2224/45015* (2013.01); *H01L 2224/45124* (2013.01); *H01L 2224/4878* (2013.01); *H01L 2224/48091* (2013.01); *H01L 2224/48245* (2013.01); *H01L 2224/48247* (2013.01); *H01L 2224/48472* (2013.01); *H01L 2224/48724* (2013.01); *H01L 2224/48739* (2013.01); *H01L 2224/48744* (2013.01); *H01L 2224/48755* (2013.01); *H01L 2224/48766* (2013.01); *H01L 2224/73215* (2013.01); *H01L 2224/73265* (2013.01); *H01L 2224/831* (2013.01); *H01L 2224/83801* (2013.01); *H01L 2224/83815* (2013.01); *H01L 2224/94* (2013.01); *H01L 2924/1305* (2013.01); *H01L 2924/13055* (2013.01); *H01L 2924/181* (2013.01)

(58) Field of Classification Search
CPC . H01L 2224/04026; H01L 2224/05007; H01L 2224/05011; H01L 2224/05073; H01L 2224/05565; H01L 2224/29027; H01L 2224/83801

USPC ........................................................ 257/779
See application file for complete search history.

(56) References Cited

U.S. PATENT DOCUMENTS

| | | | |
|---|---|---|---|
| 8,569,111 B2 | 10/2013 | Machida | |
| 8,740,043 B2 | 6/2014 | Irslinger | |
| 9,391,021 B2* | 7/2016 | Lin | ........................ H01L 21/568 |
| 2010/0089979 A1 | 4/2010 | Irslinger | |
| 2010/0123240 A1* | 5/2010 | Sato | ................... H01L 23/4334 |
| | | | 257/692 |
| 2010/0244188 A1* | 9/2010 | Mihara | ............... H01L 23/3114 |
| | | | 257/531 |
| 2011/0081750 A1 | 4/2011 | Machida | |
| 2011/0312134 A1* | 12/2011 | Machida | ............. H01L 21/4842 |
| | | | 438/123 |

FOREIGN PATENT DOCUMENTS

| | | |
|---|---|---|
| JP | 2005-183782 A | 7/2005 |
| JP | 2006-210519 A | 8/2006 |
| JP | 2008-182074 A | 8/2008 |
| JP | 2010-123686 A | 6/2010 |
| JP | 2010-272711 A | 12/2010 |
| JP | 2011-082323 A | 4/2011 |

OTHER PUBLICATIONS

International Search Report; PCT/JP2013/077115; dated Dec. 24, 2013.

An Office Action issued by the German Patent Office dated Feb. 19, 2016, which corresponds to German Patent Application No. 11 2013 006 790.0 and is related to U.S. Appl. No. 14/769,387; with English language translation.

An Office Action; "Notification of Reason(s) for Refusal," issued by the Japanese Patent Office dated Jun. 21, 2016, which corresponds to Japanese Patent Application No. 2015-504118 and is related to U.S. Appl. No. 14/769,387; with English language translation.

An Office Action issued by the Chinese Patent Office dated May 18, 2017, which corresponds to Chinese Patent Application No. 201380074382.6 and is related to U.S. Appl. No. 14/769,387; with partial English translation.

\* cited by examiner

F I G. 1 3 A
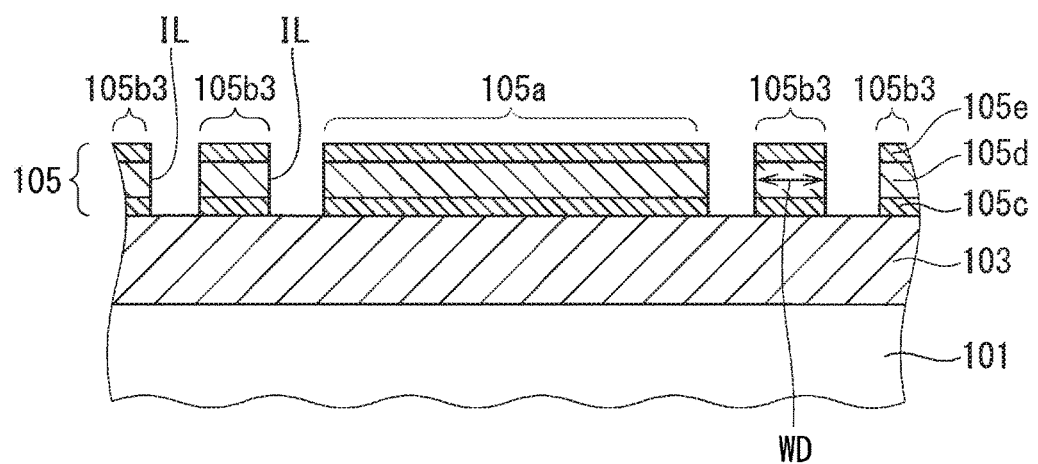
F I G. 1 3 B
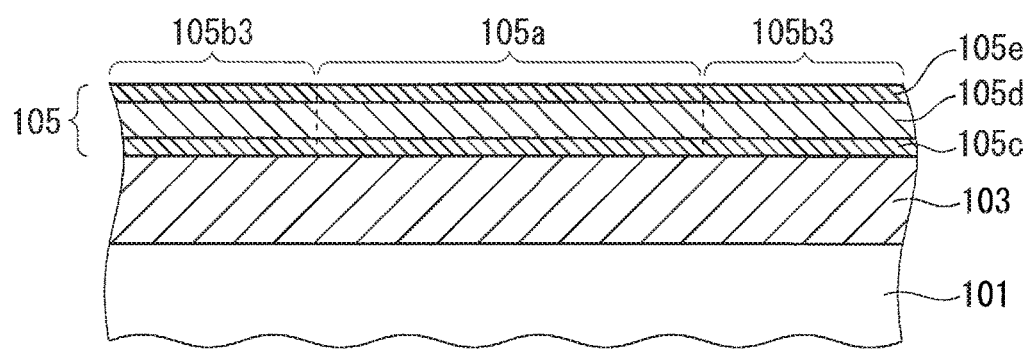

F I G. 1 7
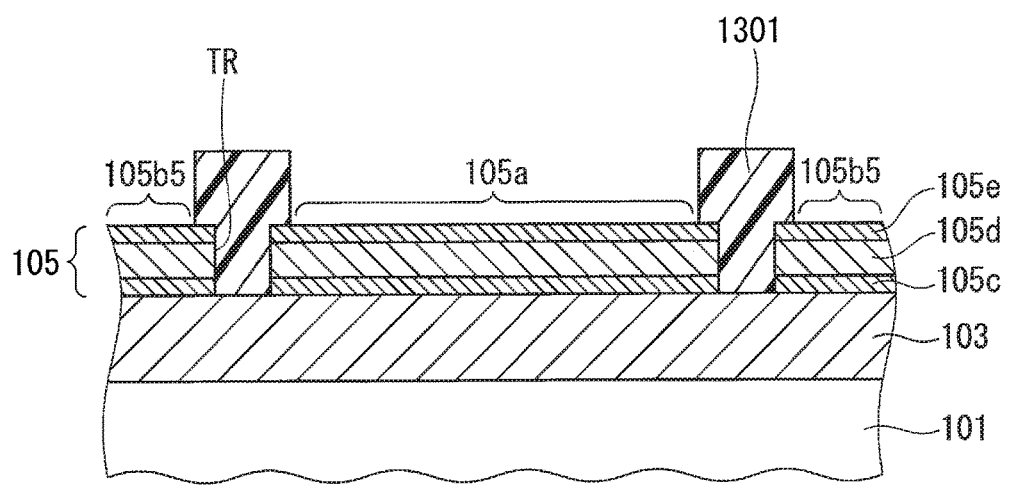

SEMICONDUCTOR DEVICE WITH METAL FILM AND METHOD FOR MANUFACTURING SEMICONDUCTOR DEVICE WITH METAL FILM

TECHNICAL FIELD

The present invention relates to a semiconductor device and a method for manufacturing a semiconductor device. More particularly, this invention relates to a semiconductor device having a wire connection structure suitable for a high-current capacity and a method for manufacturing the semiconductor device.

BACKGROUND ART

In semiconductor devices that switch high current, connections between element electrodes of semiconductor elements and external electrodes need to be suitable for the high current. In a case where solid-phase bonding by a wire bonding method is used for the connection, a plurality of metal wires that are made of aluminum or the like and have a large wire diameter are wire-bonded in parallel. To handle higher current and higher voltage, measures of increasing the number of metal wires connected in parallel or increasing the wire diameter of the metal wires need to be taken. The measures being taken increase a necessary electrode area for bonding, thereby increasing a size of the semiconductor device. Moreover, the measures have been more difficult to be taken in terms of a structure and mounting. Thus, technologies except for the wire bonding method have been developed.

Japanese Patent Application Laid-Open No. 2008-182074 (Patent Document 1) discloses that an external electrode being a copper plate is directly bonded to an element electrode of a semiconductor element with solder. This can achieve a connection capable of reducing electrical resistance and passing high current.

Japanese Patent Application Laid-Open No. 2010-272711 (Patent Document 2) discloses that an Ni layer having an appropriate thickness is formed as a metal film for solder bonding to improve reliability in the solder bonding. The optimization of the thickness of Ni can combine process feasibility with bonding reliability more sufficiently.

PRIOR ART DOCUMENT

Patent Document

Patent Document 1: Japanese Patent Application Laid-Open No. 2008-182074
Patent Document 2: Japanese Patent Application Laid-Open No. 2010-272711

SUMMARY OF INVENTION

Problems to be Solved by the Invention

In a semiconductor device including a semiconductor element, a portion of the semiconductor element through which a current flows is subjected to thermal stress due to a temperature cycle. In the thermal stress environment, the semiconductor device having the bonding structure as disclosed in Patent Document 1 needs to form an appropriate thickness of the metal film for the solder bonding to increase the bonding reliability as in Patent Document 2.

The metal film as mentioned above is patterned into a proper shape to control an expanding shape of solder when an external electrode is bonded onto the metal film. A lift-off method that is an easy patterning method is suitable for the patterning. Easiness of removal of an unnecessary portion in the lift-off method, namely, the lift-off performance, is decreased with the greater thickness of the metal film. Thus, for the metal film having the great thickness, a portion that needs to be lifted off remains, or a surface exposed by the lift-off is damaged in some cases. In this manner, for the metal film having the great thickness, yields of the lift-off process are reduced. Consequently, it is difficult to form the metal film that controls the expanding shape of the solder with high productivity.

The present invention has been made in view of the above mentioned problems, and an object thereof is to provide a semiconductor device and a method for manufacturing a semiconductor device capable of forming, with high productivity, a metal film that controls an expanding shape of solder when an external electrode is bonded.

Means to Solve the Problems

A semiconductor device according to one aspect of the present invention includes a semiconductor element, an element electrode, a metal film, and an external electrode. The element electrode is located on a surface of the semiconductor element. The metal film is located on the element electrode and includes an inner region and an outer region located around the inner region. The metal film has an opening that exposes the element electrode between the inner region and the outer region. The element electrode has solder wettability lower than solder wettability of the metal film. An external electrode is solder-bonded to the inner region of the metal film.

A semiconductor device according to another aspect of the present invention includes a semiconductor element, an element electrode, a metal film, a coating film, and an external electrode. The element electrode is located on a surface of the semiconductor element. The metal film is located on the element electrode. The coating film is partially located on the metal film and separates the metal film into an inner region and an outer region surrounding the inner region. The coating film has solder wettability lower than solder wettability of the metal film. The external electrode is solder-bonded to the inner region of the metal film.

A method for manufacturing a semiconductor device of the present invention is a method for manufacturing the semiconductor device described above and includes the steps below. A substrate with a main surface including an effective region in which the semiconductor element with the element electrode provided thereon is disposed and including an ineffective region outside the effective region is formed. The metal film is formed on the element electrode. The metal film includes a portion located on the ineffective region. The semiconductor element is cut out by dicing along a dicing line in the ineffective region after the metal film is formed. The external electrode is solder-bonded to the inner region of the metal film.

Effects of the Invention

According to this invention, the metal film that controls the expanding shape of the solder when the external electrode is bonded can be formed with the high productivity.

These and other objects, features, aspects and advantages of the present invention will become more apparent from the following detailed description of the present invention when taken in conjunction with the accompanying drawings.

BRIEF DESCRIPTION OF DRAWINGS

FIGS. 13A and 13B are a schematic partial cross-sectional view (FIG. 13A) taken along a line XIIIA-XIIIA in FIG. 12 and a schematic partial cross-sectional view (FIG. 13B) taken along a line XIIIB-XIIIB in FIG. 12.

FIG. 17 is a schematic partial cross-sectional view taken along a line XVII-XVII in FIG. 16.

DESCRIPTION OF EMBODIMENTS (First Embodiment)

Figure 1:
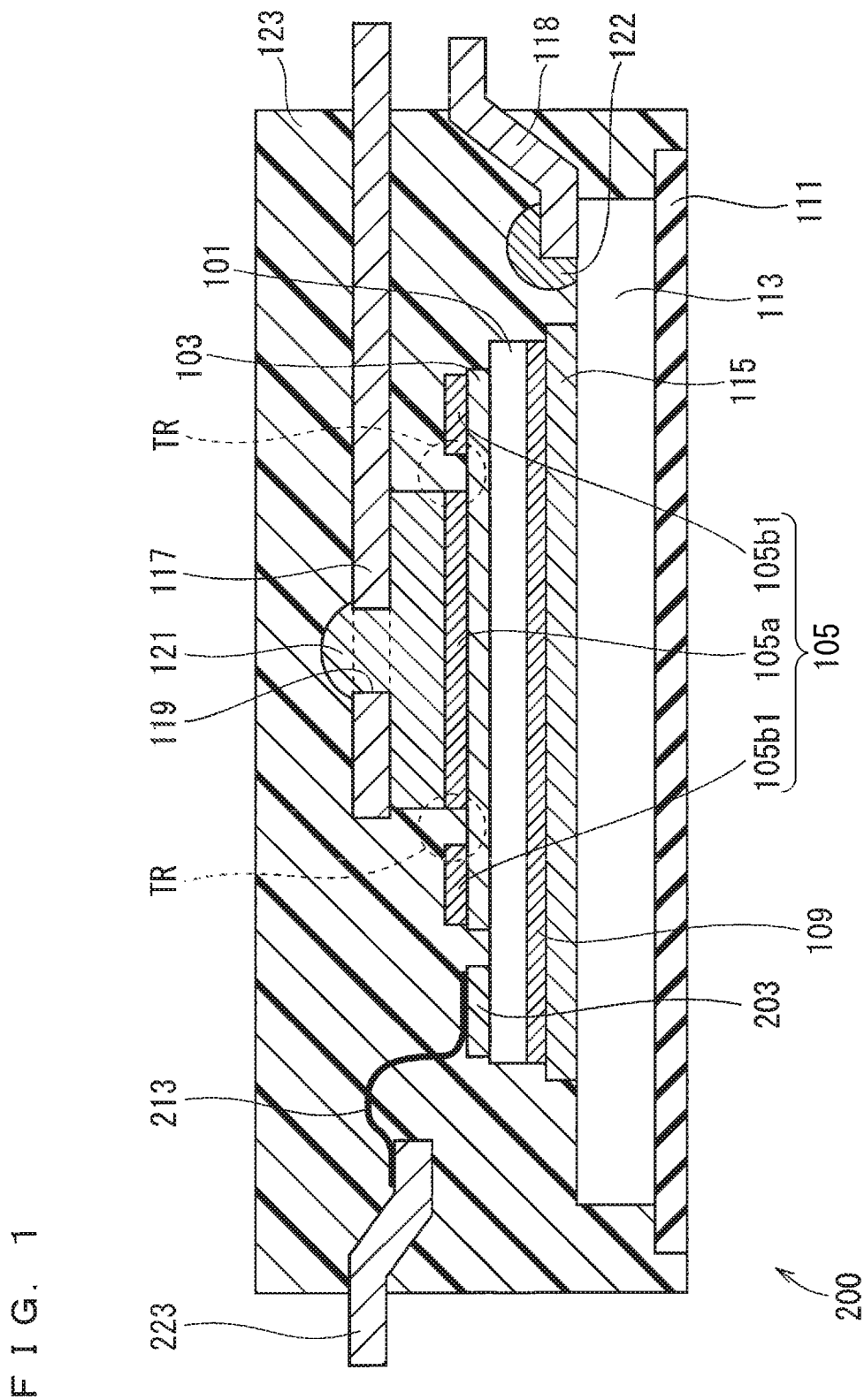
FIG. 1 is a schematic cross-sectional view showing a configuration of a semiconductor device according to a first embodiment of the present invention.
Figure 2:
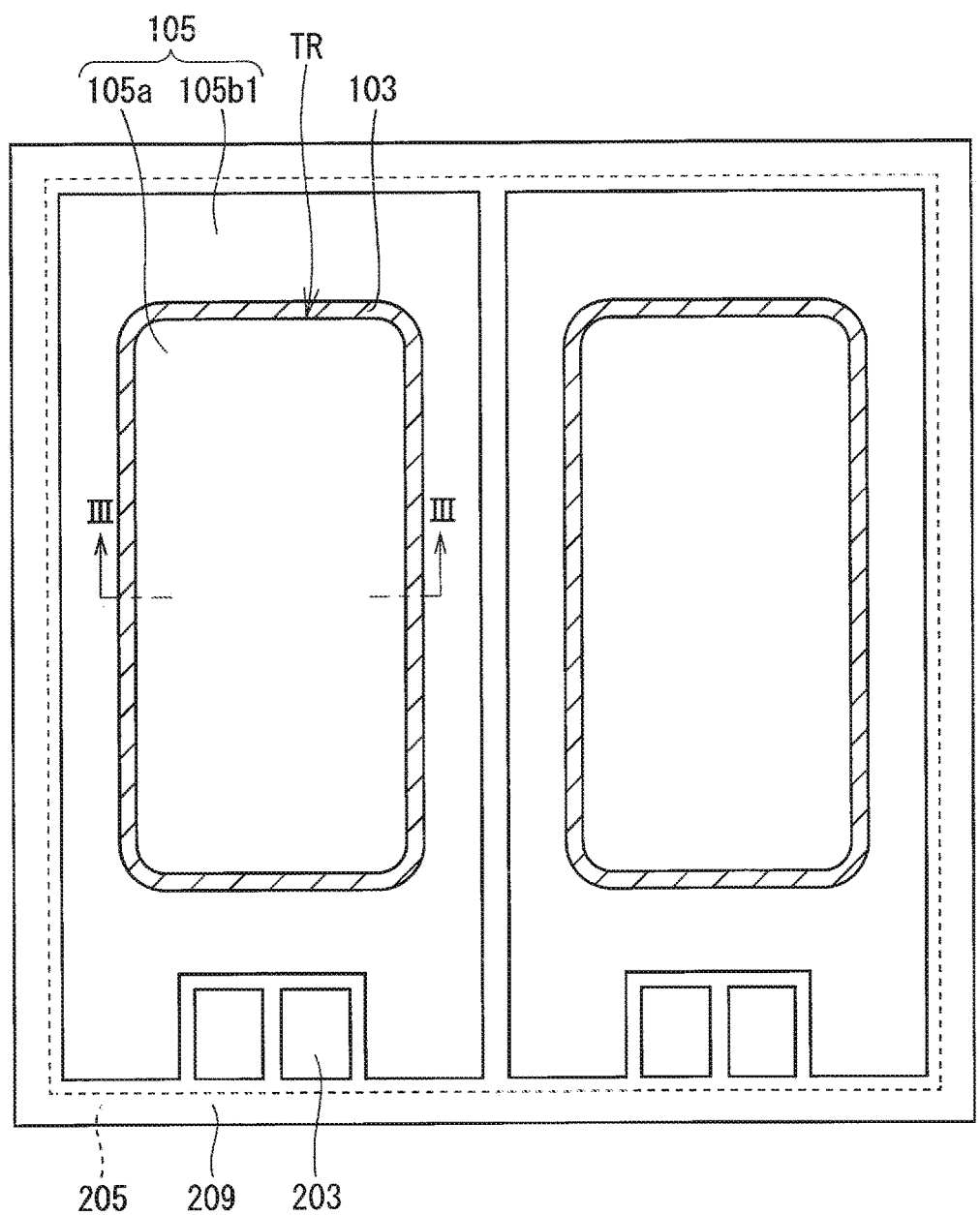
FIG. 2 is a schematic plan view showing a pattern of a metal film included in the semiconductor device in FIG. 1.

First, a configuration outline of a semiconductor device 200 will be described. FIG. 1 is a cross-sectional view showing a structure of the semiconductor device 200 according to this embodiment. FIG. 2 is a plan view showing a pattern of a metal film 105 of a semiconductor element 101 in this embodiment. In FIG. 2, a hatching pattern is added to an opening of the metal film 105 for making the diagram easy to see.

The semiconductor device 200 includes the semiconductor element 101, an emitter electrode 103 (element electrode), the metal film 105, and an external electrode 117. The emitter electrode 103 is provided on a surface of the semiconductor element 101. The metal film 105 is provided on the emitter electrode 103 and includes an inner region 105a and an outer region 105b1 located around the inner region 105a. The metal film 105 has a ditch-shaped opening TR that exposes the emitter electrode 103 between the inner region 105a and the outer region 105b1. The ditch-shaped opening TR is provided in the ditch shape between the inner region 105a and the outer region 105b1. The ditch-shaped opening TR separates the metal film 105 into the inner region 105a and the outer region 105b1. The emitter electrode 103 has solder wettability lower than solder wettability of the metal film 105. The emitter electrode 103 is solder-bonded to the inner region 105a of the metal film 105 with a solder portion 121. The inner region 105a and the outer region 105b1 are formed of the same material. Thus, the inner region 105a and the outer region 105b1 can be formed in the same process, specifically a lift-off process.

In the configuration as described above, the outer region 105b1 remains when the metal film 105 is patterned by the lift-off process, thereby reducing an area of a portion to be removed by the lift-off. High productivity of the lift-off can thus be maintained even if the metal film 105 has a relatively thick thickness. Herein, the metal film 105 preferably has the thickness of 1 μm or more for sufficiently protecting the emitter electrode 103 at a time of soldering.

The semiconductor device 200 may further include, as shown in FIG. 1, an insulating sheet 111, a base plate 113, a solder layer 115, another external electrode 118, a solder portion 122, a sealing material 123, a gate pad 203 (control electrode), a metal wire 213, and an external control electrode 223, in addition to the configuration as described above.

Next, more detailed descriptions will be given below.

The semiconductor element 101 is a vertical insulated gate bipolar transistor (IGBT) including electrodes on a front surface side and a back surface side, for example. The emitter electrode 103 as a first main electrode is provided on the upper side of the semiconductor element 101. The metal film 105 is formed on the emitter electrode 103, and the metal film 105 is separated into the inner region 105a serving as a solder bonding metal film and the outer region 105b1 serving as a dummy metal film through an exposed portion that forms the opening so as to expose the emitter electrode 103 in the ditch shape. A gate wiring (not shown) is formed to surround the emitter electrode 103 and is electrically connected to the gate pad 203. A termination region 205 is formed outside the gate wiring. The semiconductor element 101 includes a protective film 209 in a region except the gate pad 203 around the metal film 105. The semiconductor element 101 includes a collector electrode 109 as a second main electrode on the lower side thereof. The collector electrode 109 is connected to the base plate 113 on the insulating sheet 111 through the solder layer 115.

The emitter electrode 103 is made of metal and preferably has Al as a main component, and particularly, is preferably made of a material that contains 95% or more of Al. The gate pad 203 may be formed of the same material as the material for the emitter electrode 103. The gate pad 203 is typically formed in a manufacturing process that is common to a manufacturing process for the emitter electrode 103. Adopting the material that mainly contains Al for the emitter electrode 103 and the gate pad 203 allows them to be easily formed and processed, by the existing method, as the electrodes of the semiconductor element including various substrates, such as an Si substrate. Moreover, the use of Al as described above can secure bonding having excellent bonding reliability when the metal wire 213 is wire-bonded to the gate pad 203. The Al content decreases with increase in the resistance, which is not preferable to the electrode of the semiconductor device that handles the high current. Containing 95% or more of Al provides an excellent compatibility with the Al wire bonding and can also increase the conductivity.

Figure 3:
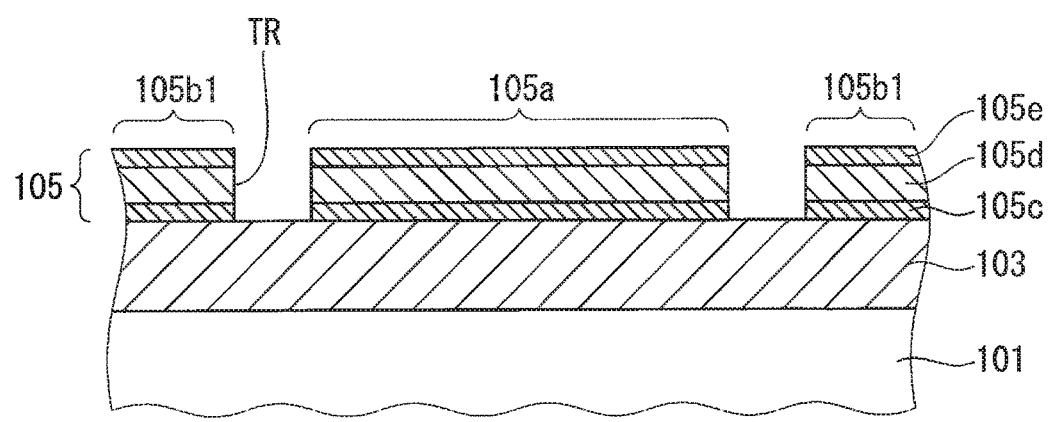
FIG. 3 is a schematic partial cross-sectional view taken along a line III-III in FIG. 2.

FIG. 3 is a schematic partial cross-sectional view showing a structure taken along a line III-III in FIG. 2. The metal film 105 formed on the emitter electrode 103 is a laminated metal film in which an adhesion securing metal film 105c, a solder bonding metal film 105d, and an oxidation preventing metal film 105e are laminated in the stated order from the emitter electrode 103 side, for example. For specific materials for each of the metal films, Ti, Ni, and Au may be used for the adhesion securing metal film 105c, the solder bonding metal film 105d, and the oxidation preventing metal film 105e, respectively. Ti is piled up on the emitter electrode 103 because adhesion between the emitter electrode 103 using the material that mainly contains Al and the solder bonding metal film 105d made of Ni is secured, and at the same time, Ni of the solder bonding metal film 105d is prevented to spread to the semiconductor element 101. The adhesion securing metal film 105c for securing the adhesion to the emitter electrode 103 may be other than Ti, and may be Mo, for example. The emitter electrode 103 using the material that mainly contains Al is hardly bonded to a Pb-free solder of, for example, SnAgCu, and thus secures the bonding properties to the solder and the solder wettability by piling up Ni through Ti. Further, oxidation of the Ni film decreases the solder wettability, so that Au is piled up as the oxidation preventing metal film 105e for the purpose of preventing the oxidation of Ni. The oxidation preventing metal film 105e may be other than Au, and may be Ag, for example. For the reasons as described above, the Ti/Ni/Au films that can be bonded to the Pb-free solder of SnAgCu and that secure the adhesion to the emitter electrode 103 are preferably piled up as the metal film 105 on the emitter electrode 103.

Figure 4:
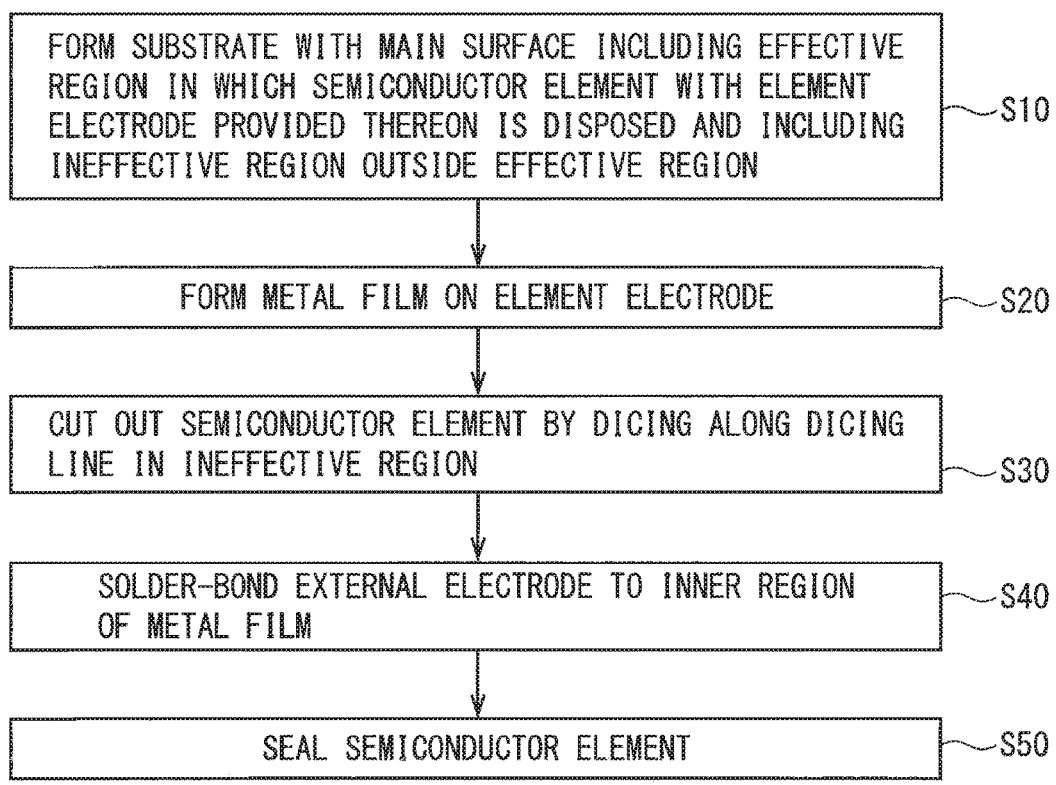
FIG. 4 is a flow chart schematically showing a method for manufacturing a semiconductor device according to the first embodiment of the present invention.
Figure 5:
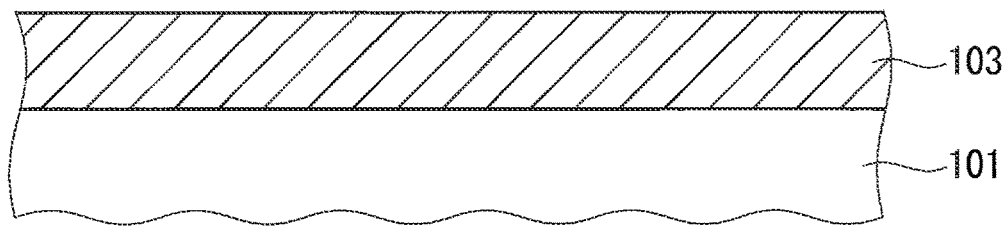
FIG. 5 is a schematic partial cross-sectional view showing a first step in the method for manufacturing a semiconductor device according to the first embodiment of the present invention.

FIG. 4 is a flow chart showing a method for manufacturing the semiconductor device 200. First, with reference to FIG. 5, a process at a so-called wafer level is almost completed in step S10 (FIG. 4), except for the formation of the metal film 105. In other words, a wafer (substrate) with a main surface including an effective region in which the semiconductor element 101 with the emitter electrode 103 (element electrode) provided thereon is disposed and including an ineffective region outside the effective region is formed. The emitter electrode 103 is a Al, AlSi, or AlCu film formed by a sputtering method. This electrode may be subjected to heat treatment at 400 to 470° C. in a hydrogen atmosphere or a nitrogen atmosphere. This heat treatment increases a size of a crystal and also improves flatness. This can improve coverage properties of the metal film 105 that is subsequently formed.

Figure 6:
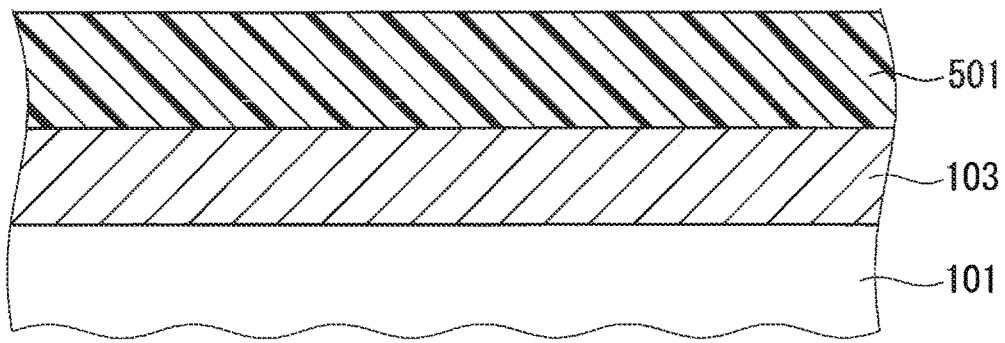
FIG. 6 is a schematic partial cross-sectional view showing a second step in the method for manufacturing a semiconductor device according to the first embodiment of the present invention.
Figure 7:
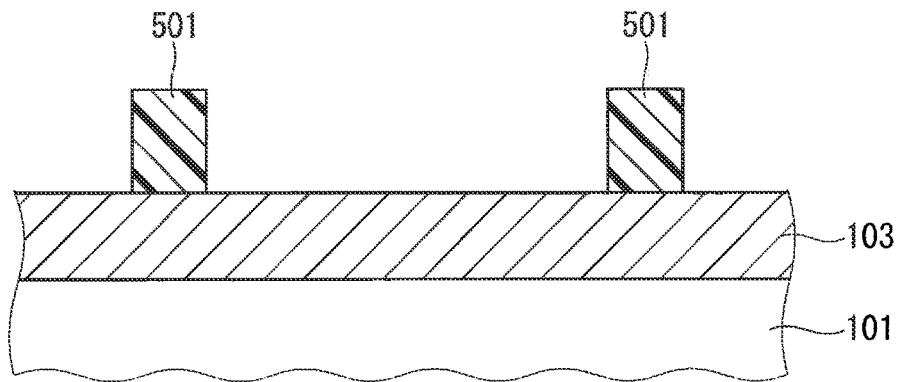
FIG. 7 is a schematic partial cross-sectional view showing a third step in the method for manufacturing a semiconductor device according to the first embodiment of the present invention.

Next, the metal film 105 is formed (FIG. 4: step S20). Particularly, with reference to FIG. 6, first, a photoresist 501 is applied. With reference to FIG. 7, an exposure and a development are performed on the photoresist 501, and thus the photoresist 501 is patterned. In this manner, the photoresist 501 may be patterned by a photolithography method. This patterning is performed such that a region which is not allowed to leave the metal film 105 eventually is coated with the photoresist 501.

Figure 8:
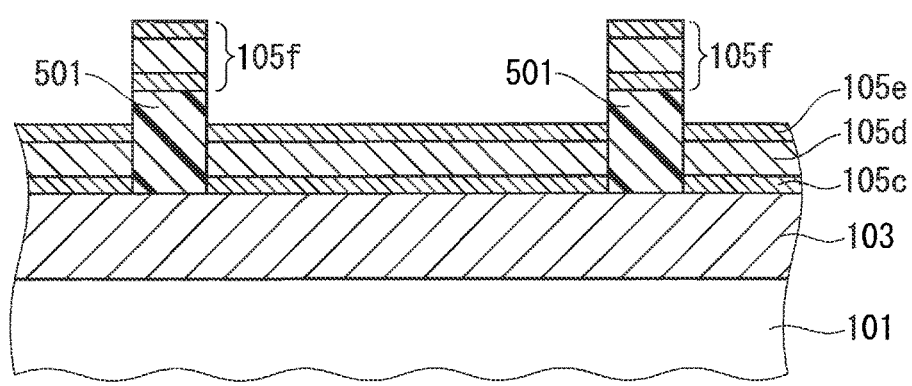
FIG. 8 is a schematic partial cross-sectional view showing a fourth step in the method for manufacturing a semiconductor device according to the first embodiment of the present invention.

With reference to FIG. 8, the metal films 105c, 105d, and 105e forming the metal film 105 are deposited. Particularly, Ti, Ni, and Au are successively laminated by the sputtering method or the like. To improve a resistance to thermal stress, Ni as the main metal of the metal film 105 is preferably piled up to be thicker than Ti and Au. A material having high hardness, such as Ni, is used at least partially (for example, a portion of the metal film 105d being part of the metal film 105), and thus the metal film 105 at least partially has the hardness higher than the hardness of the emitter electrode 103. Thus, when the solder bonding is performed on the metal film 105 described below, the emitter electrode 103 can be protected, and the damage of the emitter electrode 103 can be suppressed. If the soldering is performed, the thickness of the metal film 105 is reduced by solder leaching, and thus the thickness of Ni of the metal film 105 is preferably 1 μm or more. The remaining thickness of Ni after the soldering is preferably 0.5 μm or more, whereby the electrode can be sufficiently protected.

With reference to FIG. 3 again, the photoresist 501 and a metal film 105f thereon are removed by the lift-off process. The lift-off process includes a process below as an example. First, a thinner is used as an organic solvent to melt the photoresist 501. Next, the thinner or pure water is applied onto the wafer at high pressure to physically remove the photoresist 501 and the metal film 105f formed thereon. In this manner, the metal film 105 is formed to have the pattern including the inner region 105a and the outer region 105b1.

Figure 9A:
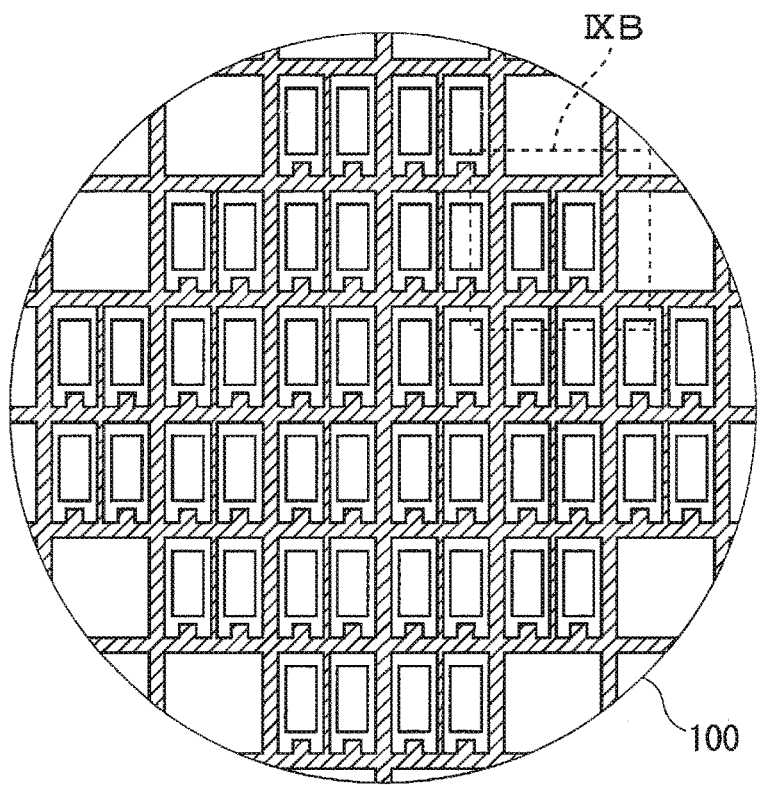
FIGS. 9A and 9B are a schematic plan view (FIG. 9A) showing a pattern of a photoresist in the step in FIG. 7 and an enlarged view (FIG. 9B) of an IXB portion thereof.
Figure 9B:
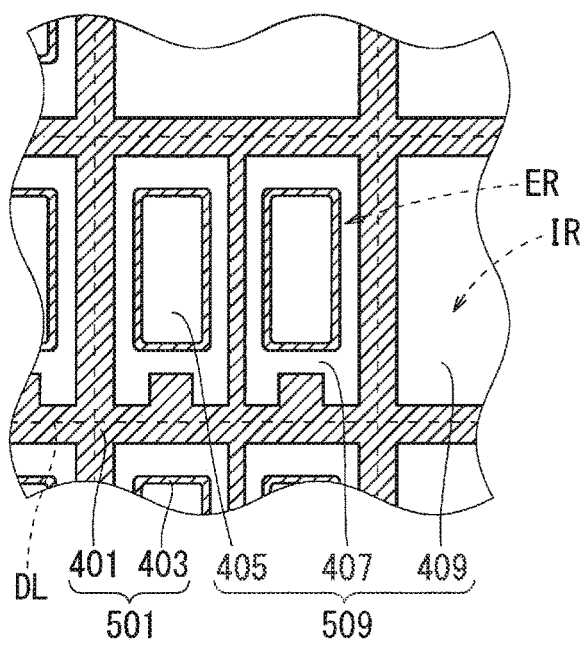

The pattern of the photoresist 501 (FIG. 7) used in the above-mentioned lift-off-process is described in detail herein. FIG. 9A shows the pattern of the photoresist 501 (FIG. 7) on the whole main surface of a wafer 100 (substrate), and FIG. 9B shows an enlarged view of an IXB portion thereof. In addition, portions in the hatching pattern in FIG. 9A and FIG. 9B indicate regions in which the photoresist 501 is disposed in a plan view.

The photoresist 501 includes a grid-shaped region 401 and a ditch-shaped region 403. The ditch-shaped region 403 is for forming the ditch-shaped opening TR (FIG. 3) in the metal film 105. The grid-shaped region 401 is for aligning a dicing line DL in the opening of the metal film 105 when a dicing is performed on the wafer 100 along the dicing line DL. The metal film 105 on the dicing line DL is at least partially removed by the lift-off, forming the opening on the dicing line DL in the metal film 105, thereby allowing to subsequently perform the easier dicing.

Moreover, an opening region 509 is provided in the photoresist 501 by the photolithography. The opening region 509 further includes a region 409 in addition to a region 405 corresponding to the inner region 105a (FIG. 2) and a region 407 corresponding to the outer region 105b1. The region 409 is disposed outside an effective region ER in which the semiconductor element 101 is disposed. In other words, the region 409 is disposed in an ineffective region IR in the wafer 100, which does not eventually become the semiconductor element 101. The ineffective region IR includes a peripheral region in the wafer 100 and a region near the dicing line DL. With the addition of region 409, the portion of the metal film 105 to be lifted off is reduced. Thus, the lift-off process can be performed with more reliability, whereby the productivity can be improved.

The pattern shown in FIGS. 9A and 9B is used as the pattern of the photoresist 501, and thus the metal film 105 assures the function of controlling the solder shape while the region as the excess metal film region needed to be removed can be reduced to a minimum.

Next, in step S30 (FIG. 4), the dicing is performed along the dicing line DL in the ineffective region IR. In this manner, the semiconductor element 101 is cut out. The semiconductor element 101 that has been cut out is packaged, and thus the semiconductor device 200 (FIG. 1) is obtained. In this packaging step, the external electrode 117 is solder-bonded to the inner region 105a of the metal film 105 (FIG. 4: step S40). This solder bonding step is described below.

The solder bonding with the solder portion 121 performed between the external electrode 117 and the inner region 105a of the metal film 105 is performed by, for example, dropping a molten solder from a through-opening 119 provided in the external electrode 117. The solder that has been dropped wets the inner region 105a and spreads thereover. The spread of the solder stops when reaching the ditch-shaped opening TR. The reason is that the emitter electrode 103 exposed by the ditch-shaped opening TR has the solder wettability lower than the solder wettability of the inner region 105a. In the case where the main material for the emitter electrode 103 is Al, a natural oxide film is formed on the surface of emitter electrode 103, so that the exposed portion of the emitter electrode 103 has poor solder wettability and the solder stops to wet and spread at the exposed portion of the emitter electrode 103 at the metal film end portion. In this manner, the emitter electrode 103 hampers the wetting and the spreading of the solder, not allowing the solder to enter the outer region 105b1 outside the exposed portion of the emitter electrode 103, and the solder shape is kept in the inner region 105a, whereby the solder portion 121 having the desired shape is obtained.

The semiconductor element 101 is eventually sealed with the sealing material 123 or the like (FIG. 4: step S50). Consequently, the semiconductor device 200 being a module including the external electrode 117 or the like mounted thereon is completed.

According to this embodiment, the metal film 105 includes the outer region 105b1 other than the inner region 105a used for the solder bonding. In other words, the outer region 105b1 is not removed by the lift-off. This can reduce a percentage of the metal film 105 removed by the lift-off in comparison to a case where the outer region 105b1 is removed. Consequently, the lift-off can be performed more easily and reliably. Furthermore, an amount of metal film 105f removed by the lift-off is small and an area of the emitter electrode 103 exposed is correspondingly small, thereby suppressing an occurrence of a scratch caused by a contact of the metal film 105f removed upon the lift-off to the emitter electrode 103. As described above, yields of the lift-off process can thus be increased. In this manner, the lift-off of the metal film 105 can be performed more easily and reliably. Therefore, even if the metal film 105 is deposited thickly, the yields of the lift-off process can be maintained and a decrease in the productivity can be suppressed.

(Second Embodiment)

Figure 10:
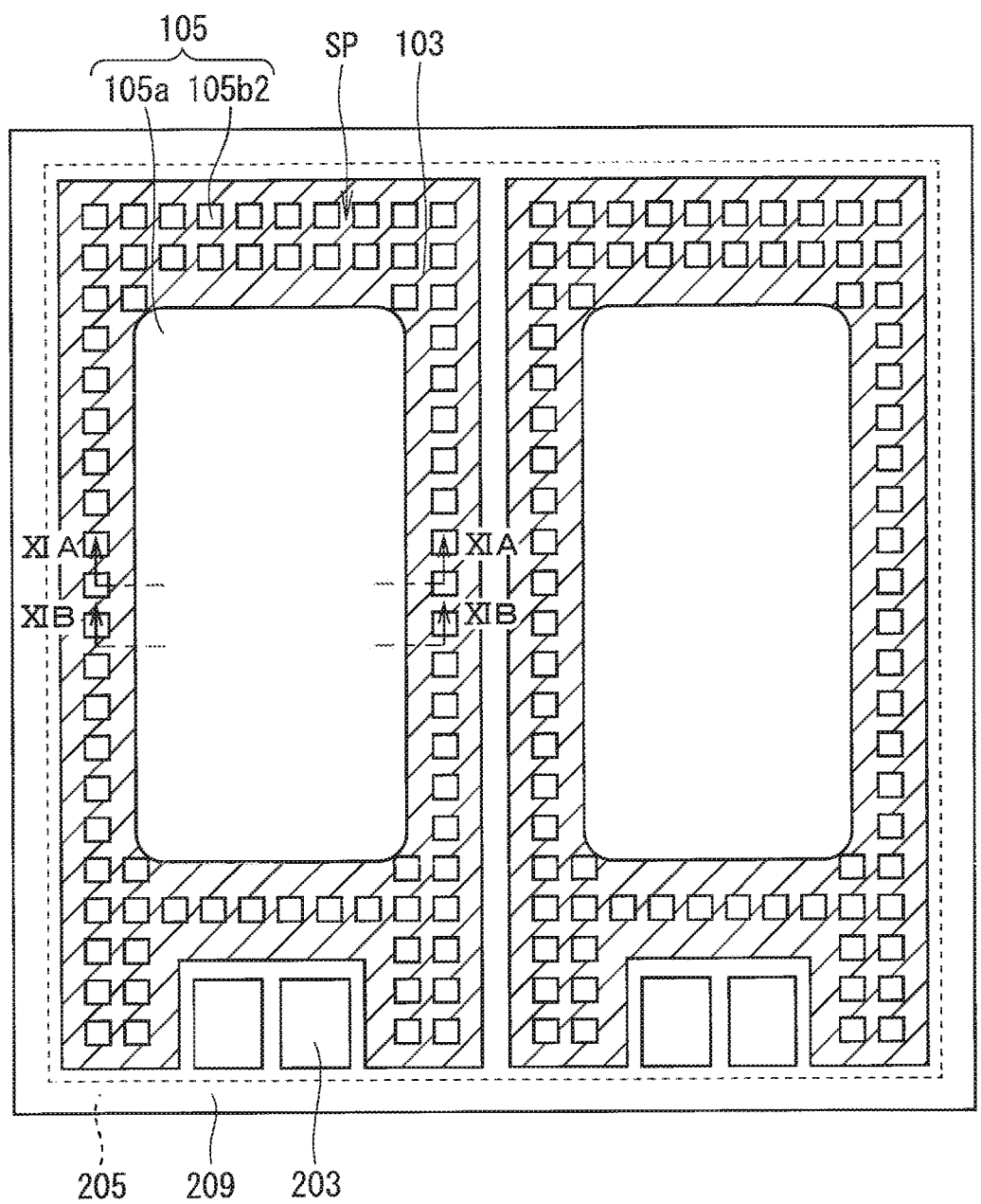
FIG. 10 is a schematic plan view showing a pattern of a metal film included in a semiconductor device according to a second embodiment of the present invention.
Figure 11A:
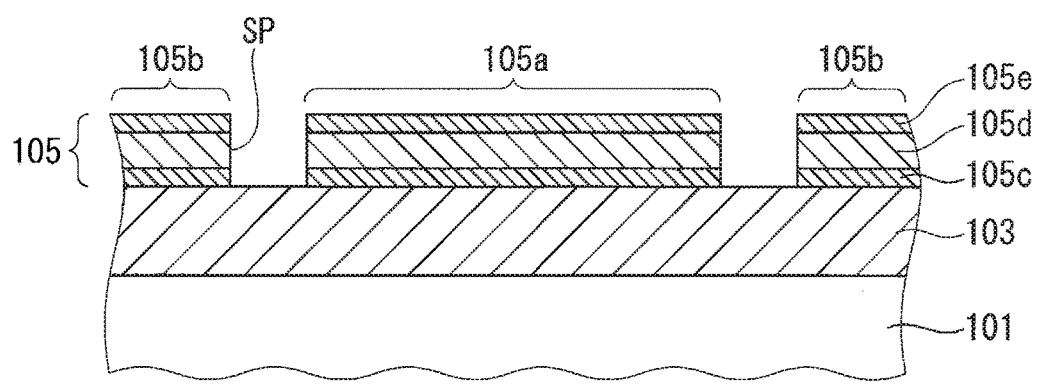
FIGS. 11A and 11B are a schematic partial cross-sectional view (FIG. 11A) taken along a line XIA-XIA in FIG. 10 and a schematic partial cross-sectional view (FIG. 11B) taken along a line XIB-XIB in FIG. 10.
Figure 11B:
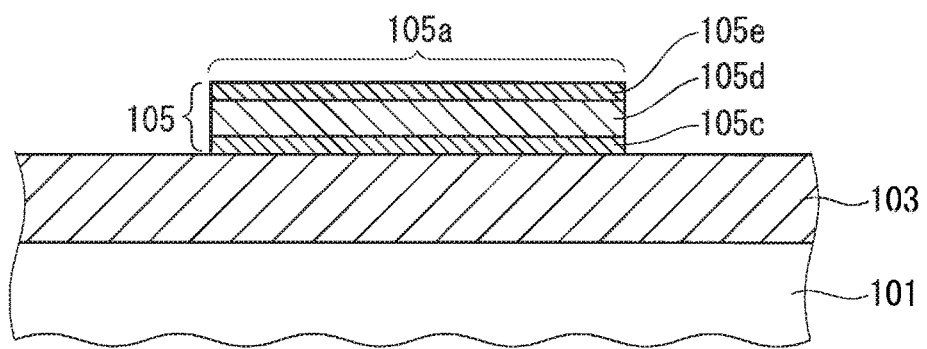

FIG. 10 is a plan view showing a pattern of a metal film 105 of a semiconductor element according to this embodiment. In FIG. 10, a hatching pattern is added to an opening of the metal film 105 for making the diagram easy to see. FIGS. 11A and 11B are schematic partial cross-sectional views showing structures taken along a line XIA-XIA and a line XIB-XIB in FIG. 10, respectively.

In this embodiment, the metal film 105 includes an inner region 105a and outer regions 105b2 located around the inner region 105a. The outer regions 105b2 similar to the outer region 105b1 (FIG. 2) are a dummy metal film that is not particularly needed for solder bonding. The outer regions 105b2 include a plurality of portions discretely located around the inner region 105a. In other words, a grid-shaped opening SP is provided in the outer regions 105b2 so as to separate the portions from each other. The other configurations in this embodiment are similar to those in the first embodiment. The solder that wets the inner region 105a and spreads thereover is kept in the inner region 105a without wetting the sufficiently small outer regions 105b2 and spreading thereover, so that the shape of the solder portion 121 (FIG. 1), namely, the solder shape after the solder bonding can be controlled.

According to this embodiment, a region of the metal film 105 that needs to be removed by the lift-off process may be increased, but there is an advantage of increasing a total edge length of the photoresist used for lifting off the metal film 105. This increases an opportunity for a thinner to enter and melt the photoresist in the lift-off process, and thus the lift-off can be performed more easily and reliably.

(Third Embodiment)

Figure 12:
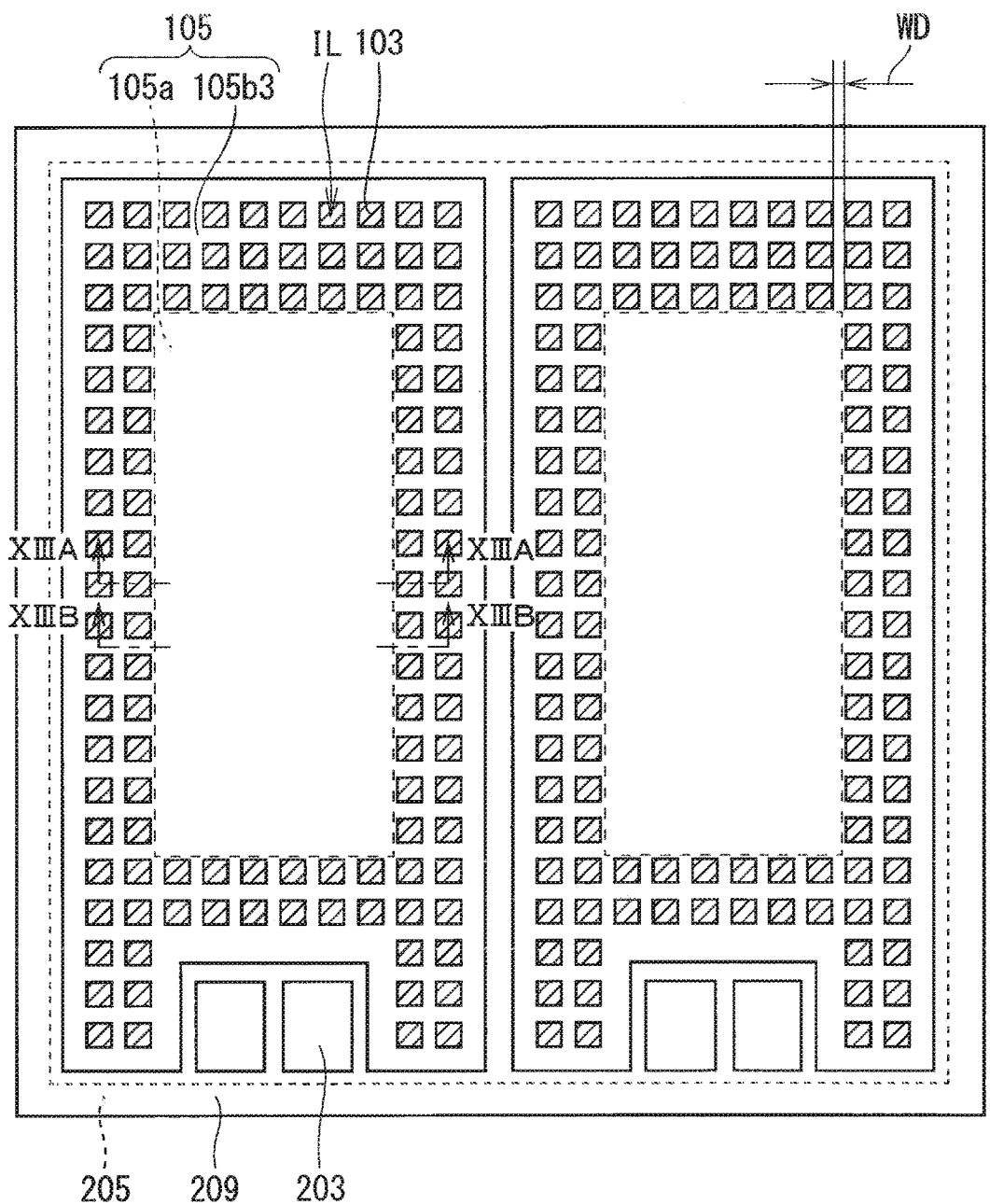
FIG. 12 is a schematic plan view showing a pattern of a metal film included in a semiconductor device according to a third embodiment of the present invention.

FIG. 12 is a plan view showing a pattern of a metal film 105 on a semiconductor element according to this embodiment. In FIG. 12, a hatching pattern is added to openings of the metal film 105 for making the diagram easy to see. FIGS. 13A and 13B are schematic partial cross-sectional views showing structures taken along a line XIIA-XIIA and a line XIIB-XIIB in FIG. 12, respectively.

In this embodiment, the metal film 105 includes an inner region 105a and an outer region 105b3 located around the inner region 105a. A plurality of discrete openings IL that expose emitter electrodes 103 are provided in the outer region 105b3. The discrete openings IL are provided, and thus the inner region 105a and the outer region 105b3 are connected to each other only with a dimension WD (one dimension) or less, as shown in FIG. 12. In a case where the molten solder is disposed on the inner region 105a, the dimension WD is small enough to hamper the spreading of the solder from the inner region 105a to the outer region 105b3.

The solder that wets the inner region 105a of the metal film 105 and spreads thereover at the time of the soldering in the above-mentioned configuration is hampered by the emitter electrodes 103 exposed in the discrete openings IL. Specifically, the line width (dimension WD in the diagram) of the outer region 105b3 between the emitter electrodes 103 exposed around the inner region 105a is sufficiently small, so that the solder is kept in the inner region 105a without wetting the outside of the inner region 105a and spreading thereto. Thus, the shape of the solder portion 121 (FIG. 1), namely, the solder shape after the solder bonding can be controlled. The other configurations in this embodiment are similar to those in the first embodiment.

As shown in FIG. 13A, the outer region 105b3 may also have a dimension less than or equal to the dimension WD in a portion separated by the discrete openings IL from the inner region 105a. This can prevent the wetting and the spreading of the solder more reliably.

According to this embodiment, a region of the metal film 105 that needs to be removed by the lift-off process may be increased, but there is an advantage of increasing an edge length of the photoresist used for lifting off the metal film 105. This increases an opportunity for a thinner to enter and melt the photoresist in the lift-off process, and thus the lift-off can be performed more easily and reliably.

(Fourth Embodiment)

Figure 14:
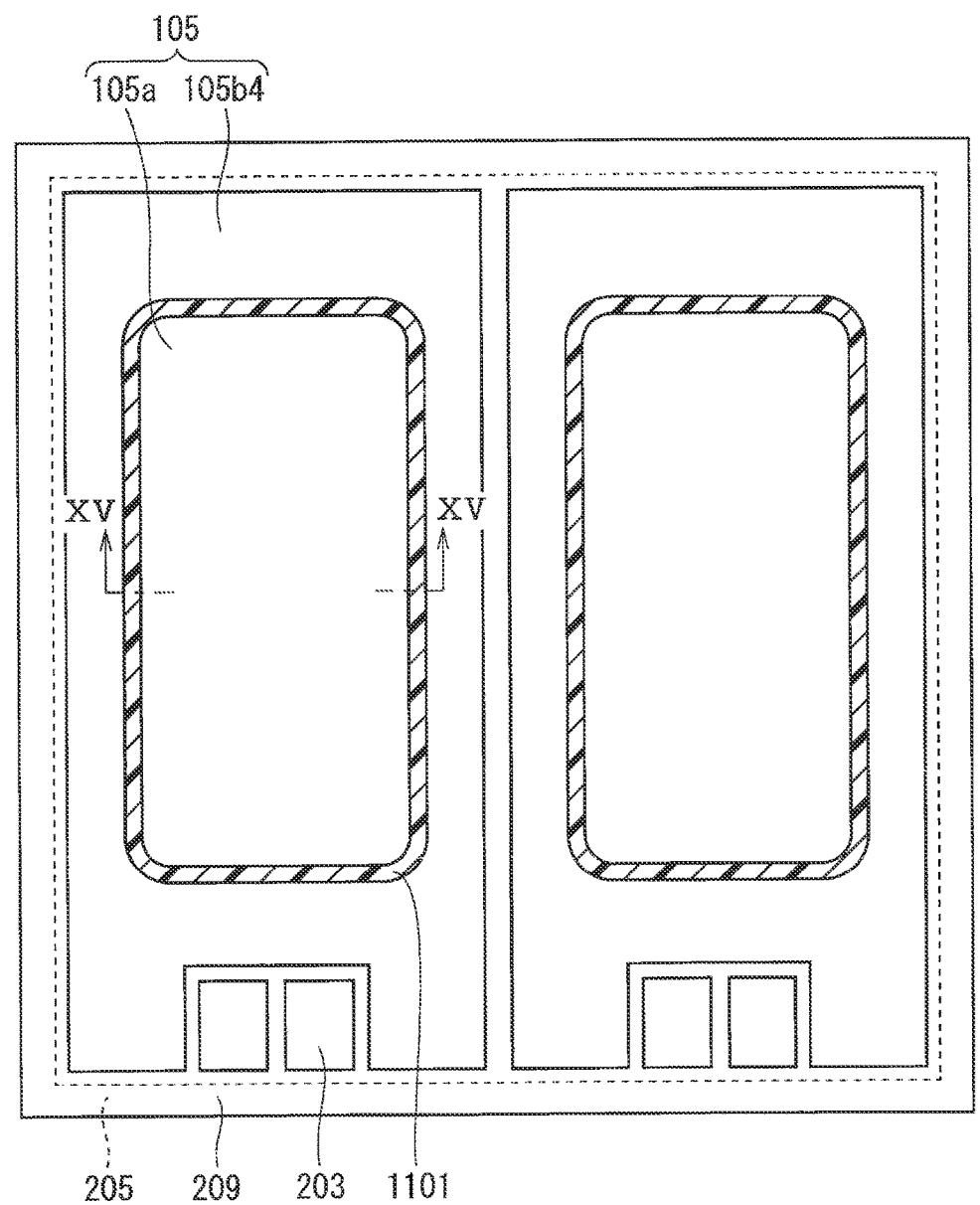
FIG. 14 is a schematic plan view showing a pattern of a metal film included in a semiconductor device according to a fourth embodiment of the present invention.
Figure 15:
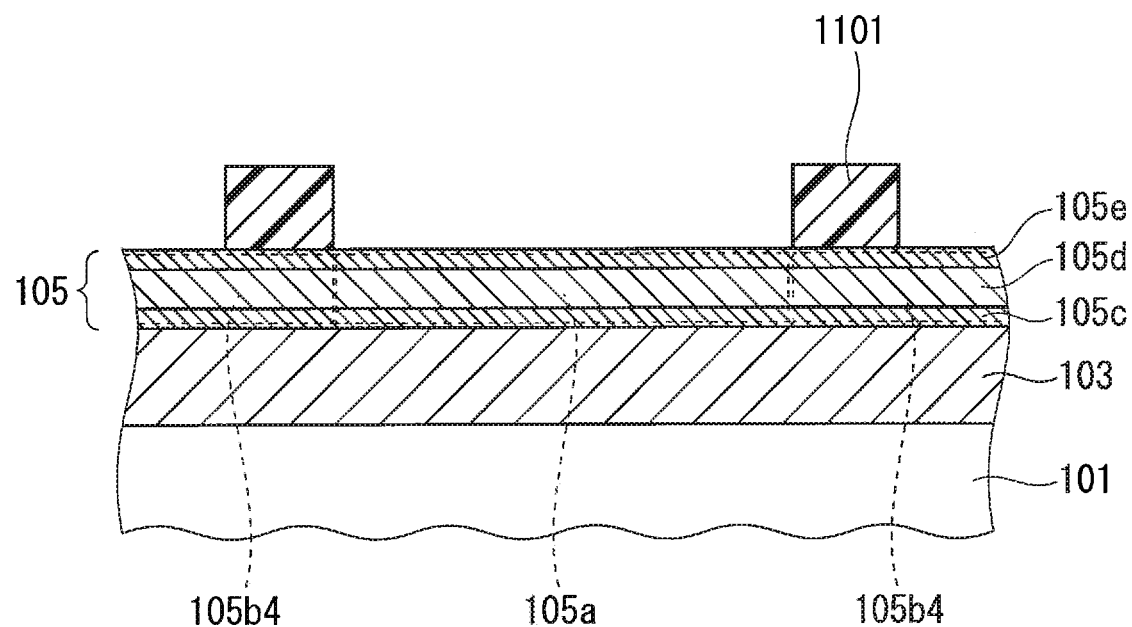
FIG. 15 is a schematic partial cross-sectional view taken along a line XV-XV in FIG. 14.

FIG. 14 is a plan view showing a pattern of a metal film 105 of a semiconductor element according to this embodiment. In FIG. 14, a hatching pattern is added to a coating film 1101 on the metal film 105 for making the diagram easy to see. FIG. 15 is a schematic partial cross-sectional view showing a structure taken along a line XV-XV in FIG. 14.

In this embodiment, the metal film 105 includes an inner region 105a and an outer region 105b4 located around the inner region 105a. The inner region 105a and the outer region 105b4 form an integrated metal film having no openings. In other words, the inner region 105a and the outer region 105b4 are connected to each other at an entire boundary between them. That is to say, the metal film 105 is formed on the entire surface of the emitter electrode 103.

The coating film 1101 for preventing the solder from entering when the external electrode 117 (FIG. 1) is solder-bonded is formed on the metal film 105. The coating film 1101 is provided partially on the metal film 105 and separates the metal film 105 into the inner region 105a and the outer region 105b4 surrounding the inner region 105a. The solder bonding between the external electrode 117 and the metal film 105 is performed on the inner region 105a. The coating film 1101 surrounds the inner region 105a. The other configurations in this embodiment are similar to those in the first embodiment.

The coating film 1101 has solder wettability lower than solder wettability of the metal film 105. In this respect, the coating film 1101 is preferably an insulating film made of polyimide. In addition, it is preferable that the thickness thereof is approximately 2 µm or more and approximately 20 µm or less. If the film thickness of the polyimide exceeds 20 µm, a warp in a wafer due to a shrinkage stress of the polyimide generated when the polyimide is baked is likely to be excessive. Moreover, if the polyimide exceeding 20 µm is stacked, evenness in the wafer surface is likely to be lost. For the coating film 1101 collectively formed with the protective film 209, the polyimide also has the function of coating and protecting the termination region 205 or the like, and when the polyimide has the film thickness of less than 2 µm, formation defects are likely to occur at a step portion or the like in the termination region 205.

The solder that wets the inner region 105a and spreads thereover is hampered by the coating film 1101, and is kept in the inner region 105a without wetting the metal film 105 outside the coating film 1101, namely, the outer region 105b4 and spreading thereover, whereby the shape of the solder portion 121 (FIG. 1), namely, the solder shape after the solder bonding can be controlled. Adopting the polyimide having high heat resistance and the thickness in the range of 2 to 20 µm for the coating film 1101 can prevent the wetting and the spreading of the solder more reliably, maintaining process consistency.

Forming the coating film 1101 of the same material as that for a passivation film (not shown) provided on the semiconductor element 101 simplifies the manufacturing steps. In addition, collectively forming both of them reduces the number of the steps. The material for the passivation film may be polybenzoxazole, the other silicon resin materials, or the like, except for the polyimide. The use of these can complete the step of forming the coating film 1101 during a wafer process before dicing. Moreover, the coating film 1101 can also be formed by using, as the other material used during the wafer process, a silicon oxide film or a silicon nitride film formed by a chemical vapor deposition (CVD) method, except for an organic material typified by the polyimide and the polybenzoxazole. When the nitride film or the oxide film is formed by the CVD method, the solder bonding metal film 105d may be deposited on the oxidation preventing metal film 105e by a heat load at the time of the CVD, and oxidation of the deposit may hinder the solder wettability. The oxidation preventing metal film 105e needs to be formed thickly to suppress the deposition of 105e, but when the oxidation preventing metal film 105e is made of Au or Ag, a cost is increased by making the oxidation preventing metal film 105e thick. Thus, when the oxidation preventing metal film 105e is made of Au or Ag, the material for the coating film 1101 is preferably the organic material typified by the polyimide or the polybenzoxazole.

According to this embodiment, the lift-off of the metal film 105 on the emitter electrode 103 is not particularly needed unlike the first to third embodiments as described above, so that the lift-off of the metal film 105 may be performed only on the termination region 205, the dicing line DL, the gate pad 203, or the like. This simplifies the lift-off process, thereby increasing the productivity.

(Fifth Embodiment)

Figure 16:
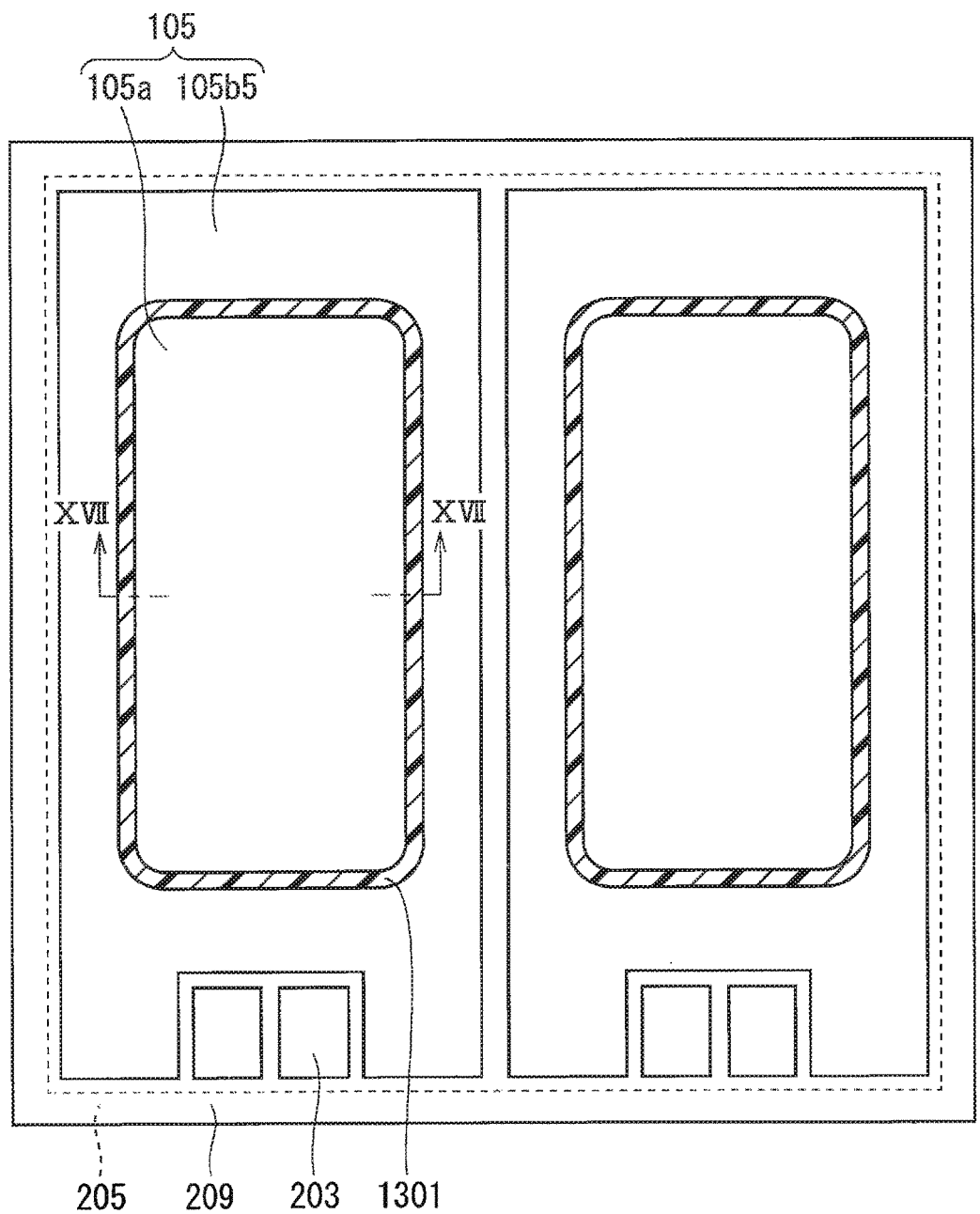
FIG. 16 is a schematic plan view showing a pattern of a metal film included in a semiconductor device according to a fifth embodiment of the present invention.

FIG. 16 is a plan view showing a pattern of a metal film 105 of a semiconductor element according to this embodiment. In FIG. 16, a hatching pattern is added to a coating film 1301 for making the diagram easy to see. FIG. 17 is a schematic partial cross-sectional view showing a structure taken along a line XVII-XVII in FIG. 16.

In this embodiment, the metal film 105 includes an inner region 105a and an outer region 105b5 located around the inner region 105a. The outer region 105b5 is almost the same as the outer region 105b1 (FIG. 2). In other words, the metal film 105 has a ditch-shaped opening TR (FIG. 17) that exposes an emitter electrode 103 between the inner region 105a and the outer region 105b5. The ditch-shaped opening TR surrounds the inner region 105a being a region in which solder bonding is performed. A coating film 1301 for preventing the solder from entering is formed on the ditch-shaped opening TR. As shown in FIG. 17, the coating film 1301 having a width larger than an opening width of the ditch-shaped opening TR surrounds the region in which the solder bonding is performed similarly to the ditch-shaped opening TR. A material for the coating film 1301 and a method for forming the coating film 1301 are similar to those for the coating film 1101 (fourth embodiment). In addition, the configuration except for the one mentioned above is almost the same as the configuration in the fourth embodiment as described above, so that the same or corresponding components are denoted by the same references, which are not repeated here.

For example, when Au is used for the outermost surface layer of the metal film 105 and the coating film 1301 is a polyimide film, a pattern of the polyimide is formed on the metal film 105, possibly leading to separation of the polyimide during the wafer process or the solder bonding due to the low adhesion between Au and the polyimide. In this embodiment, the polyimide film and the emitter electrode 103 are in close contact with each other through the ditch-shaped opening TR of the metal film 105, whereby the separation of the polyimide can be prevented. This effect is greater when a material having Al content greater than that of the metal film 105 is used for the emitter electrode 103. The emitter electrode 103 particularly formed of the material that contains 95% or more of Al has great adhesion to the polyimide, whereby the risk of the separation of the polyimide film can be further reduced. The similar effects are also obtained when a material that contains Au or Ag is used for the outermost surface layer of the metal film 105 and a material having Au or Ag content lower than that the outermost surface layer of the metal film 105 is used for the emitter electrode 103.

According to this embodiment, the coating film 1301 that is more hardly separated than the coating film 1101 in the fourth embodiment can be formed. Thus, the shape of the solder portion 121 (FIG. 1) can be controlled more reliably by the coating film 1301.

In addition, the opening formed in the metal film 105 in this embodiment is similar to the ditch-shaped opening TR in the first embodiment, but the shape of the opening is not limited thereto. For example, the shape similar to the grid-shaped opening SP (FIG. 10: second embodiment) or the discrete opening IL (FIG. 12: third embodiment) may be used.

The lift-off process in each of the embodiments as mentioned above is not limited to being performed by applying a thinner or pure water onto a photoresist at high pressure. The lift-off may be, for example, performed by applying tape to a metal film and peeling off the tape. In this case, the metal film on the photoresist is removed by adhesion of the tape.

In addition, according to the present invention, the above embodiments can be arbitrarily combined. Each embodiment can be appropriately varied or omitted within the scope of the invention.

While the invention has been shown and described in detail, the foregoing description is in all aspects illustrative and not restrictive. The present invention is not restricted to that. It is therefore understood the numerous modifications and variations can be devised without departing from the scope of the invention.

(Additional Remarks)

The specification includes disclosure of (i) to (ix) below.

(i) A semiconductor device (200), including:
a semiconductor element (101);
an electrode (103) located on a surface of the semiconductor element;
a first metal film (105a) located on a surface of the electrode and in a shape for controlling a solder shape after solder bonding;
a second metal film (105b1) disposed in a shape that coats a region of the electrode except for the first metal film so as to form an exposed portion that forms an opening (TR) exposing the electrode in a ditch shape along a periphery of the first metal film; and
an external electrode (117) solder-bonded to the first metal film.

The configuration of this semiconductor device can be read from, for example, the first embodiment described above.

(ii) A semiconductor device (200), including:
a semiconductor element (101);
an electrode (103) located on a surface of the semiconductor element;
a first metal film (105a) located on a surface of the electrode and in a shape for controlling a solder shape after solder bonding;
a plurality of second metal films (105b2) discretely arranged in a shape smaller than the first metal film in an exposed portion that exposes the electrode around the first metal film; and
an external electrode (117) solder-bonded to the first metal film.

The configuration of this semiconductor device can be read from, for example, the second embodiment described above.

(iii) A semiconductor device (200), including:
a semiconductor element (101);
an electrode (103) located on a surface of the semiconductor element;
a first metal film (105) located on a surface of the electrode; and
an external electrode (117) solder-bonded to the first metal film, wherein the first metal film includes:
a solder-bonded region (105a) for being solder-bonded to the external electrode; and
exposed portions (IL) that expose the electrode in a region except for the solder-bonded region to form a thin line width (WD) that hampers the solder to enter.

The configuration of this semiconductor device can be read from, for example, the third embodiment described above.

(iv) The semiconductor device (200) according to any one of (i) to (iii) includes a coating film (1301) located on the exposed portion and in the shape for controlling the solder shape at the time of the solder bonding.

The configuration of this semiconductor device can be read from, for example, the fifth embodiment described above.

(v) A semiconductor device (200), including:
a semiconductor element (101);
an electrode (103) located on a surface of the semiconductor element;
a metal film (105) located on a surface of the electrode; and
a coating film (1101) located on the metal film and in a shape for controlling a solder shape at a time of solder bonding.

The configuration of this semiconductor device can be read from, for example, the fourth embodiment described above.

(vi) The semiconductor device according to (iv) or (v) described above, wherein the coating film is made of polyimide having a thickness of 2 to 20 μm.

(vii) The semiconductor device according to any one of (i) to (vi) described above, wherein the electrode is made of a material that contains 95% or more of aluminum.

(viii) A method for manufacturing the semiconductor device according to any one of (i) to (vii) described above, wherein in the step of forming the first metal film, the same metal film as the first metal film is also formed on an ineffective region (IR) that is not used as a semiconductor device in an entire region in a wafer (100) surface.

(ix) The method for manufacturing the semiconductor device according to (viii) described above, wherein an opening is formed in the metal film on the ineffective region and the opening is located on a dicing line (DL).

DESCRIPTION OF NUMERALS 100 wafer (substrate); 101 semiconductor element; 103 emitter electrode (element electrode); 105 metal film; 105a inner region; 105b1 to 105b5 outer region; 117 external electrode; 121 solder portion; 200 semiconductor device; 1101, 1301, coating film; DL dicing line; ER effective region; IL discrete opening (opening); IR ineffective region; SP grid-shaped opening (opening); TR ditch-shaped opening (opening).

The invention claimed is:
1. A semiconductor device, comprising:
a semiconductor element;
an element electrode located on a surface of said semiconductor element;
a metal film that is located on said element electrode and includes an inner region and an outer region located around said inner region, said metal film having an opening that exposes said element electrode between said inner region and said outer region, said element electrode having solder wettability lower than solder wettability of said metal film; and an external electrode solder-bonded to said inner region of said metal film, wherein
said inner region and said outer region of said metal film are each located on said element electrode.

2. The semiconductor device according to claim 1, wherein said inner region and said outer region of said metal film are separated by said opening.

3. The semiconductor device according to claim 2, wherein said opening is provided in a ditch shape between said inner region and said outer region of said metal film.

4. The semiconductor device according to claim 2, wherein said outer region of said metal film includes a plurality of portions discretely arranged.

5. The semiconductor device according to claim 1, wherein
said inner region and said outer region of said metal film are connected to each other only with one dimension or less, and said one dimension is small enough to hamper spreading of the solder from said inner region to said outer region in a case where a molten solder is disposed on said inner region of said metal film.

6. The semiconductor device according to claim 1, wherein said inner region and said outer region of said metal film are formed of the same material.

7. The semiconductor device according to claim 1, wherein said inner region and said outer region of said metal film are formed in the same step.

8. The semiconductor device according to claim 1, wherein said metal film at least partially has hardness higher than hardness of said element electrode.

9. The semiconductor device according to claim 1, wherein said metal film has a thickness of 1 µm or more.

10. The semiconductor device according to claim 1, wherein the metal film controls the expanding shape of a solder when an external electrode is bonded to the metal film.

11. The semiconductor device according to claim 1, further comprising a solder layer disposed between said metal film and said external electrode and bonding said external electrode to said metal film.

12. A semiconductor device, comprising:
a semiconductor element;
an element electrode located on a surface of said semiconductor element;
a metal film located on said element electrode;
a coating film that is partially located on said metal film, separates said metal film into an inner region and an outer region surrounding said inner region, and has solder wettability lower than solder wettability of said metal film; and
an external electrode solder-bonded to said inner region of said metal film,
wherein said metal film has an opening that exposes said element electrode between said inner region and said outer region, and said coating film is disposed in said opening, and
said inner region and said outer region of said metal film are each located on said element electrode.

13. The semiconductor device according to claim 12, wherein said coating film includes a polyimide film having a thickness of 2 µm or more and 20 µm or less.

14. The semiconductor device according to claim 12, wherein said element electrode is made of a material that contains 95% or more of aluminum.

15. The semiconductor device according to claim 12, further comprising a solder layer disposed between said metal film and said external electrode and bonding said external electrode to said metal film.

* * * * *